(12) United States Patent
Bossart et al.

(10) Patent No.: US 11,385,596 B2
(45) Date of Patent: Jul. 12, 2022

(54) METHOD FOR MANUFACTURING A TIMEPIECE COMPONENT

(71) Applicant: ROLEX SA, Geneva (CH)

(72) Inventors: Richard Bossart, Lausanne (CH); Edward Michelet, Bienne (CH)

(73) Assignee: ROLEX SA, Geneva (CH)

( * ) Notice: Subject to any disclaimer, the term of this patent is extended or adjusted under 35 U.S.C. 154(b) by 206 days.

(21) Appl. No.: 16/202,293

(22) Filed: Nov. 28, 2018

(65) Prior Publication Data

US 2019/0137934 A1 May 9, 2019

Related U.S. Application Data

(62) Division of application No. 15/105,438, filed as application No. PCT/EP2014/078857 on Dec. 19, 2014, now Pat. No. 10,209,676.

(30) Foreign Application Priority Data

Dec. 20, 2013 (EP) ..................................... 13198950

(51) Int. Cl.
| | |
|---|---|
| *B32B 3/00* | (2006.01) |
| *G04B 19/04* | (2006.01) |
| *B81C 99/00* | (2010.01) |
| *G04B 15/14* | (2006.01) |
| *G04B 17/06* | (2006.01) |

(52) U.S. Cl.
CPC .......... *G04B 19/042* (2013.01); *B81C 99/008* (2013.01); *G04B 15/14* (2013.01);
(Continued)

(58) Field of Classification Search
CPC ............. Y10T 428/15; Y10T 29/49579; Y10T 29/49799; Y10T 29/4979; G04B 15/14; G04B 19/042
See application file for complete search history.

(56) References Cited

U.S. PATENT DOCUMENTS

| | | |
|---|---|---|
| 9,770,771 B2 | 9/2017 | Barrot et al. |
| 2004/0207063 A1 | 10/2004 | Lutter |

(Continued)

FOREIGN PATENT DOCUMENTS

| | | |
|---|---|---|
| CN | 102224464 A | 10/2011 |
| DE | 102008061182 A1 | 6/2010 |

(Continued)

OTHER PUBLICATIONS

Japanese Office Action dated Oct. 9, 2018 in application JP2016-541211, counterpart of parent application (with English machine translation; 6 pages) (D2, WO2013093108A1, D5, US20100005659A1, D7, EP0732635A1, and D8, US20140361217A1 cited in the Japanese Office Action dated Oct. 9, 2018 are not listed in this IDS since they are already listed in another IDS form filed concurrently).

(Continued)

*Primary Examiner* — Alexander S Thomas
(74) *Attorney, Agent, or Firm* — WHDA, LLP

(57) ABSTRACT

The invention relates to a method which comprises the steps of providing a plate (2) made of a micromachinable material, forming the timepiece component (1) with at least one attachment (3) for keeping the component attached to the rest of the plate (2), by etching the plate (2); and creating, along a desired breakage line of the attachment, a pre-detachment area (4) comprising at least one gap (5) obtained by etching into the body of the plate (2).

18 Claims, 6 Drawing Sheets

(52) U.S. Cl.
CPC ......... *G04B 17/063* (2013.01); *G04B 17/066* (2013.01); *B32B 3/00* (2013.01)

(56) References Cited

U.S. PATENT DOCUMENTS

| | | | |
|---|---|---|---|
| 2009/0154303 A1* | 6/2009 | Vaucher | G04B 13/022 368/322 |
| 2010/0005659 A1 | 1/2010 | Dinger et al. | |
| 2011/0225801 A1 | 9/2011 | Fussinger et al. | |
| 2014/0363217 A1 | 12/2014 | Barrot et al. | |

FOREIGN PATENT DOCUMENTS

| | | |
|---|---|---|
| EP | 0 732 635 A1 | 9/1996 |
| EP | 2 145 857 A1 | 1/2010 |
| JP | H11-352249 A | 12/1999 |
| JP | 2010-019844 A | 1/2010 |
| WO | 2013/093108 A1 | 6/2013 |

OTHER PUBLICATIONS

Chinese Office Action dated Feb. 1, 2018 in application CN201480070092.9, counterpart of parent application (with English machine translation; 19 pages) (D2, WO2013093108 cited in the Chinese Office Action is not listed in this IDS since it is listed in another IDS form iled concurrently).

International Search Report and Written Opinion dated Jul. 3, 2015 issued in application No. PCT/EP2014/078857 corresponding to parent application; w/ English partial translation and partial machine translation (20 pages).

* cited by examiner

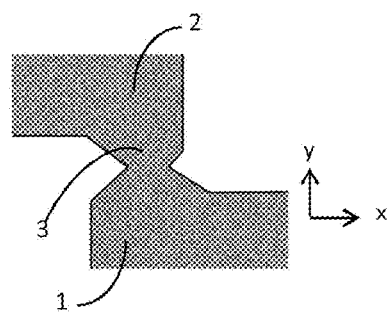
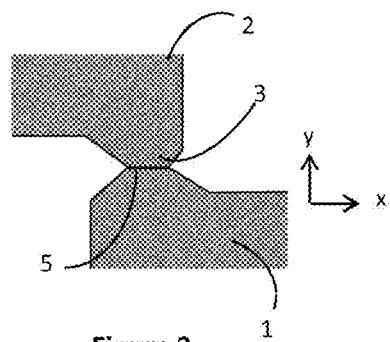
Figure 2
Background Art
Figure 3
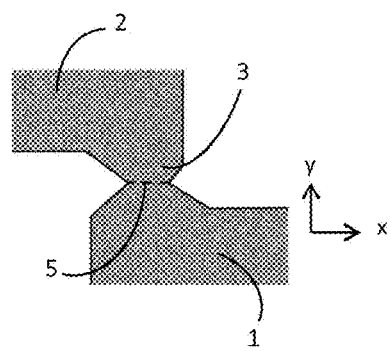
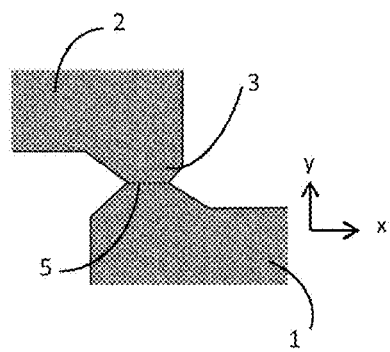
Figure 4
Figure 5
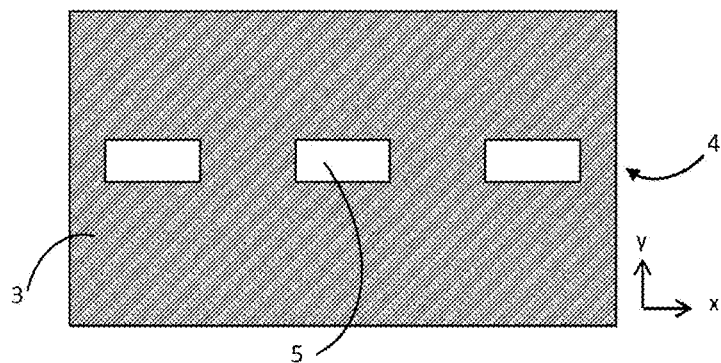
Figure 6

METHOD FOR MANUFACTURING A TIMEPIECE COMPONENT

This application is a divisional of U.S. application Ser. No. 15/105,438 filed Jun. 16, 2016, now U.S. Pat. No. 10,209,676 which is a national stage of PCT/EP2014/078857 filed Dec. 19, 2014, all of which claim priority of European patent application No. 13198950.1 filed Dec. 20, 2013, which is hereby incorporated by reference herein in its entirety.

The present invention relates to a method for manufacturing a horology component made from a micromachinable material.

It is known practice to manufacture timepiece components from a micromachinable material such as silicon and using techniques derived from the microelectronics industry, notably deep reactive ion etching (DRIE). The method of manufacture generally comprises the following steps:
  procuring a sheet of micromachinable material, for example made of silicon,
  forming the horology component, by etching through the entire thickness of the sheet,
  freeing the component by separating it from the rest of the sheet.

The use of materials and manufacturing techniques derived from the microelectronics industry offers highly attractive possibilities, notably in terms of precision. One difficulty that needs to be overcome is nevertheless that of how to free the component without damaging it. In general, attachments, or bridges of material, are provided between the horology component and the rest of the sheet. These attachments have the purpose of keeping the component attached to the sheet throughout the manufacture of the component, notably during treatments applied to the component after etching (heat treatment, application of a coating, etc.) while at the same time making the component easier to free at the end of manufacture.

Document EP2145857 describes a method for manufacturing a horology component analogous to the one described hereinabove. Bridges of material are etched and firmly tether the component to the sheet during the various steps in the manufacture of the horology component. In order to make the component easy to free at the end of manufacture, the bridges of material have a cross section which is narrower at the end connected to the component. That makes it possible to create a zone of weakness making the bridges of material easier to fracture. At the end of manufacture, the horology component is freed from the sheet by brittle fracture of the material at the attachments, or bridges of material, in response to a suitable mechanical stress.

The breakage of the material by brittle fracture between the bridge of material and the component is difficult to control.

Document WO 2013/093108 describes a method for manufacturing a micromechanical component from a sheet of micromachinable material, attachments being formed between the component and the sheet. These attachments are locally weakened by thinning in order to create hinges. These are suited to allowing the component to be detached by a twisting force in the plane of the sheet. This then results in fracture between the component and the sheet but the fracture lacks precision. The point of fracture cannot be determined precisely beforehand. It will be somewhere along the weakened attachment, but it is impossible to tell in advance whether it will be close to the component or close to the sheet. This may prove troublesome both from a functional and from an esthetic standpoint. In addition, in order to free the component using torsion in the plane of the sheet, it is necessary to provide space around the component so as to allow relative movement between the sheet and the component. That means reducing the number of components manufactured from one sheet.

The present invention seeks to improve the situation.

To this end, the invention relates to a method for manufacturing a horology component, comprising the following steps:
  procuring a sheet of a micromachinable material;
    forming the horology component with at least one attachment tethering it to the rest of the sheet, by etching the sheet;
  wherein there is also a step consisting in creating, along a line of desired fracture of the attachment, a predetachment zone comprising at least one opening obtained by etching into the thickness of the sheet.

The invention consists in forming a predetachment zone along a precisely determined fracture line. One or several openings are etched into the thickness of the sheet so as to create a zone of lower mechanical strength, corresponding to the predetachment zone, and to initiate fracture at the desired location along the desired fracture line.

The horology component may be obtained by etching the sheet throughout its entire thickness. In other words, in this case one or several through-openings are etched into the sheet in order to form the component.

In one particular embodiment, said opening is obtained by etching part of the thickness of the sheet.

According to one first embodiment, said opening extends along the entirety of the fracture line.

According to a second embodiment, the predetachment zone comprises a plurality of openings aligned along the fracture line.

The length of the openings may be comprised for example between 2 and 10 μm.

Definitively, the predetachment zone may comprise a single opening extending all along the fracture line, or several openings aligned along the fracture line and separated by bridges. In any event, the fracture surface obtained once the horology component has been freed from the sheet is far cleaner than with a standard attachment. Furthermore, the risk of creating crack initiators in the component is limited.

Advantageously, the depth of the opening is less than or equal to 90% of the thickness of the sheet, preferably less than or equal to 60% of said thickness.

Advantageously too, the depth of the opening or of the openings is greater than or equal to half the thickness of the sheet.

The width of the opening or openings may be comprised between 1 and 10 μm, notably between 1 and 5 μm.

In one particular embodiment, the etching of the horology component and the etching of the opening of the predetachment zone are performed simultaneously.

In this case, the width of said opening of the predetachment zone is advantageously less than the width of a through-opening intended to form the horology component, notably less than the smallest of the widths of a plurality of through-openings forming the horology component.

In one particular embodiment, with the width of through-opening intended to form the component being greater than 40 μm, the width of said opening of the predetachment zone is comprised between 1 and 10 μm, notably between 1 and 5 μm.

Such a width of predetachment opening encourages detachment of the component brought about by a mechanical stress in a direction perpendicular to the plane of the sheet and is very simple and practical to implement.

Advantageously, the etching of the horology component and the etching of the opening of the predetachment zone are performed using deep reactive ion etching.

In another embodiment, the etching of the opening of the predetachment zone and the etching of the horology component are performed separately, respectively using femtosecond laser micromachining and using deep reactive ion etching.

The material of the sheet may be a brittle material, notably one of the materials from the group containing silicon, diamond, quartz and ceramic.

Advantageously, it comprises a step of freeing the horology component by fracturing or breaking the attachment along the fracture line.

Advantageously, during the step of freeing the horology component, fracture is brought about by applying a mechanical force to the attachment in a direction that is at an angle of 45° or less with respect to a direction perpendicular to the sheet, notably 30° or less with respect to a direction perpendicular to the sheet, preferably in a direction perpendicular or substantially perpendicular to the sheet.

As a result of this, the freeing of the horology component is simple and practical to perform. Furthermore, it does not require space to be left around the components. It is therefore possible to optimize the use of the sheet for manufacturing as many components as possible therefrom.

The horology component may be one of the elements from the group comprising a balance spring, a wheel, a hand, a spring, a pallet and a balance-wheel.

The invention also relates to a sheet of micromachinable material comprising a horology component and at least one attachment tethering the horology component to the rest of the sheet, these being formed by openings etched into the thickness of the sheet, and which also comprises a zone for predetachment of the horology component comprising, along a line of desired fracture of the attachment, at least one opening etched into the thickness of the sheet.

The invention finally relates to a horology component made of a micromachinable material, comprising a partially etched fracture zone.

The invention will be better understood from the following description of a number of exemplary embodiments of the method for manufacturing a horology component of a sheet of micromachinable material incorporating a horology component and of a horology component according to the invention, with reference to the attached drawings in which:

FIGS. 1A, 1B and 1C respectively depict a view from above and a view in cross section (in the plane yz) of an attachment between a horology component and a sheet of micromachinable material, and a partial view of the horology component, of the sheet and of the attachment, according to a first embodiment;

FIG. 2 depicts a view of a bridge of material between a horology component and a sheet of micromachinable material, according to the prior art;

FIG. 3 depicts a view from above of a bridge of material between a horology component and a sheet of micromachinable material, according to an embodiment analogous to that of FIGS. 1A and 1B;

FIG. 4 depicts a view from above of a bridge of material between a horology component and a sheet of micromachinable material, according to a second embodiment;

FIG. 5 depicts a view from above of a bridge of material between a horology component and a sheet of micromachinable material, according to an alternative form of the second embodiment;

FIG. 6 depicts an enlarged and partial view of a predetachment zone of a bridge of material according to an alternative form of the second embodiment;

Figure 9:
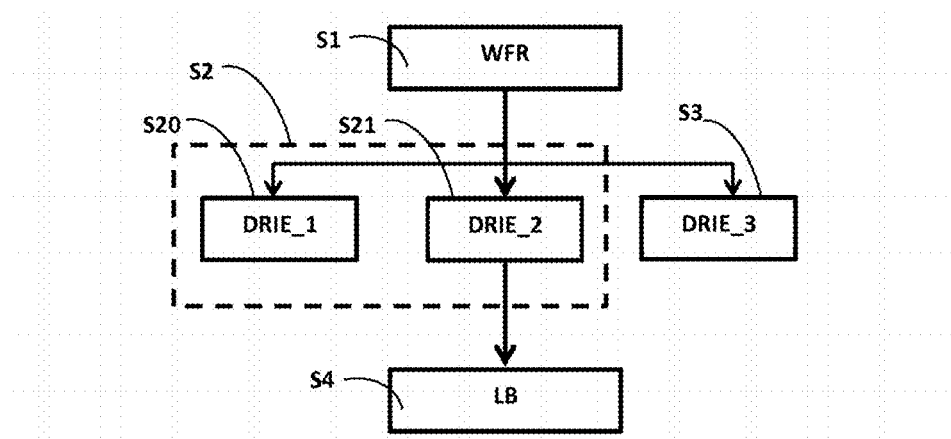
FIG. 9 depicts a flow diagram of the steps of the method of manufacture, according to one particular embodiment.

With reference to FIG. 9, the method of the invention chiefly comprises four steps S1, S2, S3 and S4 intended to manufacture a horology component 1 from a micromachinable material.

A "micromachinable" material means any material suited to micromachining. According to the Berner illustrated professional dictionary of horology, micromachining means "the collection of techniques derived from the microelectronics industry (chemical attack, photolithography, chemical vapor deposition, etc.) supplemented by other techniques that allow the machining of a vast range of materials such as semiconductors, ceramics, metals, certain polymers, etc.". The micromachinable material used in the embodiments described hereinafter is silicon. Other micromachinable materials could obviously be used in its place, such as diamond, quartz and ceramic for example.

The step S1 consists in procuring a sheet 2 of micromachinable material, in this instance a silicon wafer, similar to those used for the manufacture of microelectronics components. The wafer has, for example, a thickness of 150 µm. Quite obviously, other thicknesses of wafer may be used.

The step S2 consists in forming within the sheet a horology component 1 and one or several attachments 3 tethering the component 1 to the rest of the sheet 2. The horology component 1 and its attachments 3 are produced simultaneously, respectively during the substeps referenced S20 ("DRIE_1") and S21 ("DRIE_2"), by photolithography followed by deep reactive ion etching. During these steps S20 and S21, parts around the component 1 and around the attachments 3 are etched into the sheet 2, in this instance throughout its thickness. In other words, a pattern made up of through-openings is etched into the sheet 2, the shapes of these openings being tailored to forming the component 1 and its attachments 3.

As an alternative, in order to form the horology component, use could be made of a sheet formed of several layers, for example a sheet of SOI formed of two layers of Si sandwiching a layer of SiO2, in which one of the layers of Si is used to form the component, and the other layer of Si is used as a support. In such a case, a "through-opening" means an opening that passes through the entirety of the layer of Si in which the component is formed rather than an opening that passes through the entire sheet of SOI.

The purpose of the attachments 3 is to tether the horology component 1 to the sheet 2 during manufacture and allow the horology component 1 to be freed, by fracturing the attachment 3, at the end of manufacture. The attachments 3 are bridges of material between the etched horology component 1 and the rest of the sheet 2. They may have varying shapes.

Figure 1A:
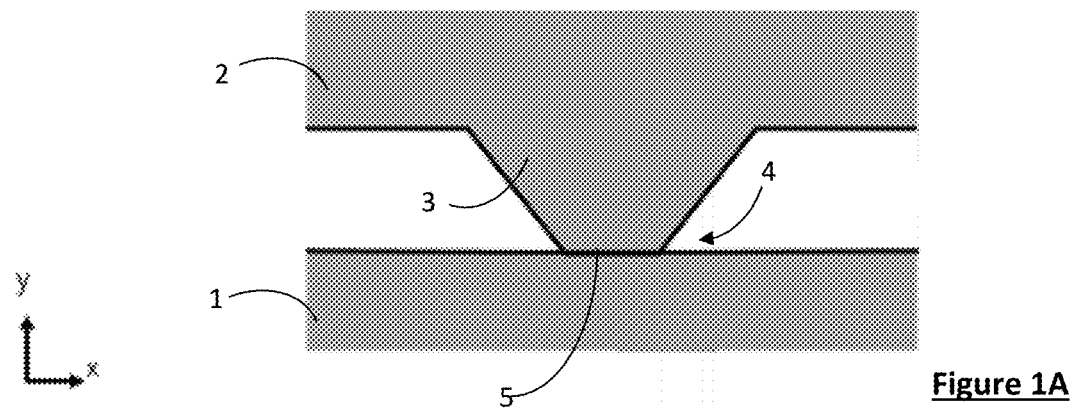
Figure 1B:
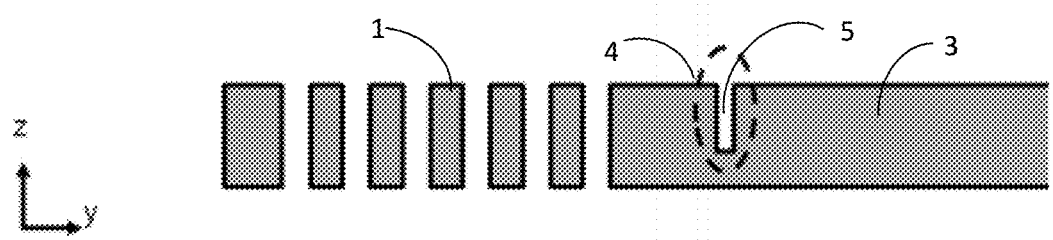

By definition, the "length" of an attachment is the dimension of the attachment in a longitudinal direction connecting the middles of the two connecting ends of the attachment (which respectively connect it to the rest of the sheet 2 and to the component 1), in the plane of the sheet 2 (namely a plane parallel to the upper and lower surfaces of the sheet, through which plane the sheet extends). Similarly, the "width" is the name given to the dimension of the attachment in a direction perpendicular to the longitudinal direction. In FIGS. 1A and 1B, the length of the attachment 3 corresponds to the dimension along the axis y and its width corresponds to the dimension along the axis x.

In the exemplary embodiment illustrated in FIGS. 1A and 1B, the width of the attachment 3 decreases continuously from its end connecting it to the rest of the sheet 2 to its end connecting it to the horology component 1. However, other forms of attachment 3, notably an attachment of constant width, possibly with narrowing close to the end connecting it to the component, could be envisioned.

Figure 1C:
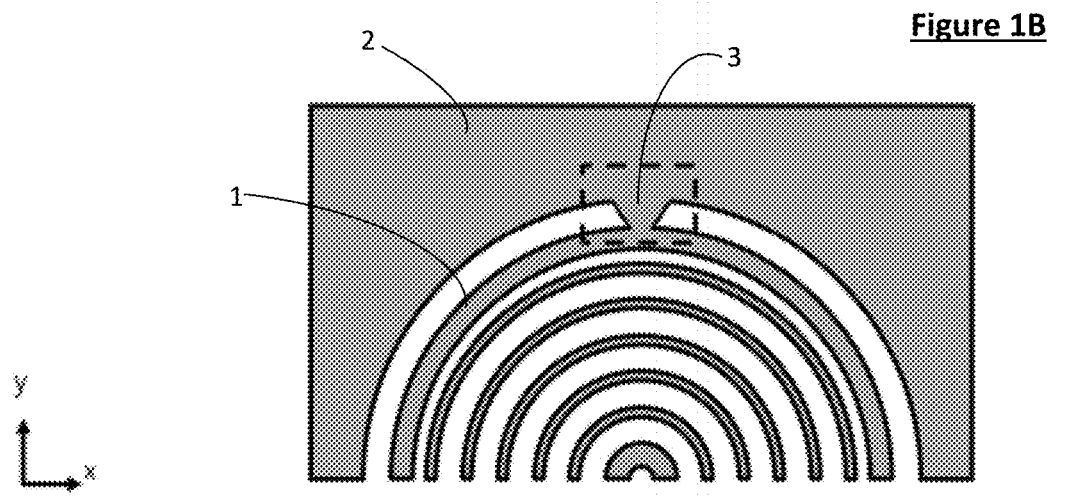

In FIGS. 1A, 1B and 1C, the horology component 1 depicted is a balance spring (only half of the balance spring, from the center to the edge, being depicted in FIGS. 1B and 1C). Clearly, the method of the invention applies to the manufacture of other horology components. The horology component may be an entity ready to be mounted in a movement (for example a hand, a spring, etc.) or a part intended to be assembled with one or more other parts (for example a balance spring to the balance staff, a wheel disk to its arbor, a pallet to the pallet staff (or arbor), a balance-wheel to the balance staff, etc.) prior to mounting.

Step S3 consists in creating, for each attachment 3, along a desired fracture line for the attachment 3, a predetachment zone 4.

A "fracture line" means a line in the plane of the sheet along which the fracture of the material is desired when the component 1 is being freed from the sheet 2. The fracture line here comprises a straight segment extending in the widthwise direction of the attachment 3 (namely in the direction x), and over the entire width of the attachment 3, at the connecting end connecting the attachment 3 to the component 1. Quite clearly other forms of fracture line and other locations (for example in the middle of the attachment, or at the connecting end connecting it to the sheet), could be envisioned.

The predetachment zone 4 extends along the fracture line, at the connecting end connecting the attachment 3 to the horology component 1, across the entire width of the attachment 3 (in the direction x in figure LA). The length of the predetachment zone 4, namely its dimension along the fracture line (namely in the direction x in figure LA) is, for example, comprised between 20 and 150 µm.

In the exemplary embodiment depicted in FIGS. 1A and 1B, in order to create the predetachment zone 4, an opening 5 which extends continuously along the entirety of the fracture line and thus crosses the attachment 3 in its widthwise direction is etched. The opening 5 has the form of a trench extending in the direction x and having an upright U-shaped cross section (FIG. 1B).

The depth of the trench 5 is, for example, equal to approximately 75% of the total thickness of the sheet (or of the component) and its width (namely its dimension in the direction y) is, for example, of the order of 4 µm. The depth and the width of the trench 5 may obviously have other values. For example, the depth may be greater than or equal to half the thickness of the sheet (or of the component) and less than or equal to 90% of the thickness of the sheet (or of the component), preferably less than or equal to 60% of said thickness. The width may be greater than or equal to 1 µm and less than or equal to 10 µm, preferably less than 5 µm.

The etching of the horology component 1 ("DRIE_1") and the etching of the opening 5 ("DRIE_3") of the predetachment zone 4 may be performed simultaneously by deep reactive ion etching (DRIE).

The opening 5 makes it possible to create, within the attachment 3, at the connecting end connecting the attachment 3 to the component 1, a zone of lower mechanical strength (namely the predetachment zone 4) and to initiate fracture at the desired point on the component 1.

The step S4 consists in freeing the horology component from the sheet 2 by fracture or breakage of the attachments 3 along their fracture line. The fracturing may be brought about by applying a mechanical force to the attachment 3 in a direction perpendicular, or substantially perpendicular, to the plane of the sheet (corresponding to the direction z in FIGS. 1A and 1B). "Substantially perpendicular" means a direction having an angle of more or less 10° with respect to the direction perpendicular to the sheet (or perpendicular to the plane of the sheet). As an alternative, fracture is brought about by applying a mechanical force to the attachment 3 in a direction at an angle less than or equal to 45° with respect to a direction perpendicular to the sheet, notably less than or equal to 30° with respect to a direction perpendicular to the sheet. Because the material of the sheet 1 is a brittle material, having no plastic-deformation domain, the force applied perpendicular or substantially perpendicular or even in a direction close to perpendicular to the sheet has the effect of breaking the material at the predetachment zone 4, along the fracture line. Fracture is made easier and controlled thanks to the predetachment zone 4. It might also be possible to envision freeing the component 1 from the sheet 2 by supplementing the etching of the attachment in the predetachment zone 4 with a laser treatment, notably using femtosecond laser treatment equipment.

Fracture through mechanical stress in a direction perpendicular to the plane of the sheet, or in other words by pulling or twisting in the direction z is simple to perform and beneficial to achieving components, notably balance springs or wheels. On the other hand, fracture by mechanical stress in a plane of the sheet, in other words by twisting in a direction contained in the x-y plane, for example by operating a hinge, would be impractical to implement. This is because it would require space to be left around the component in order to allow the elements to move, and that space would therefore not be able to be used for the creation of other components.

Figure 7A:
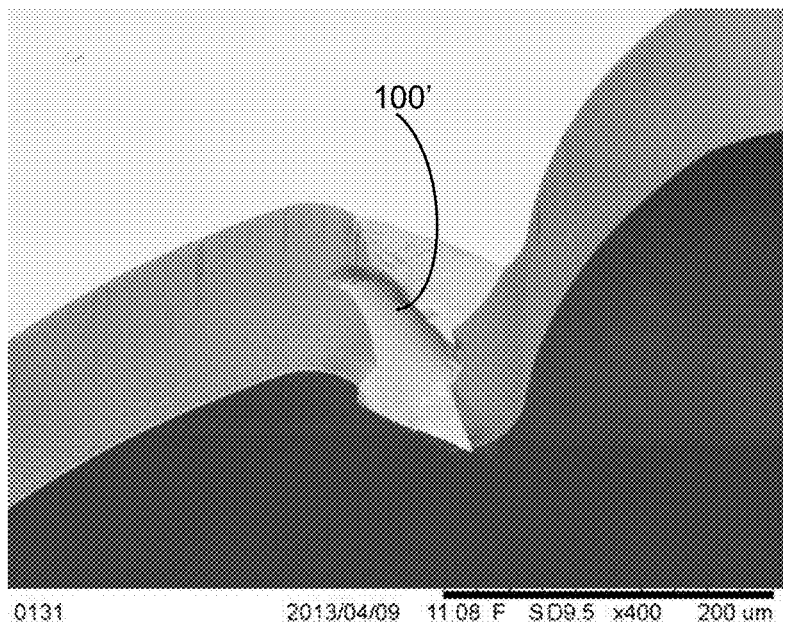
FIGS. 7A and 7B depict fracture zones of, respectively, a horology component according to the prior art and a horology component according to the first embodiment.
Figure 7B:
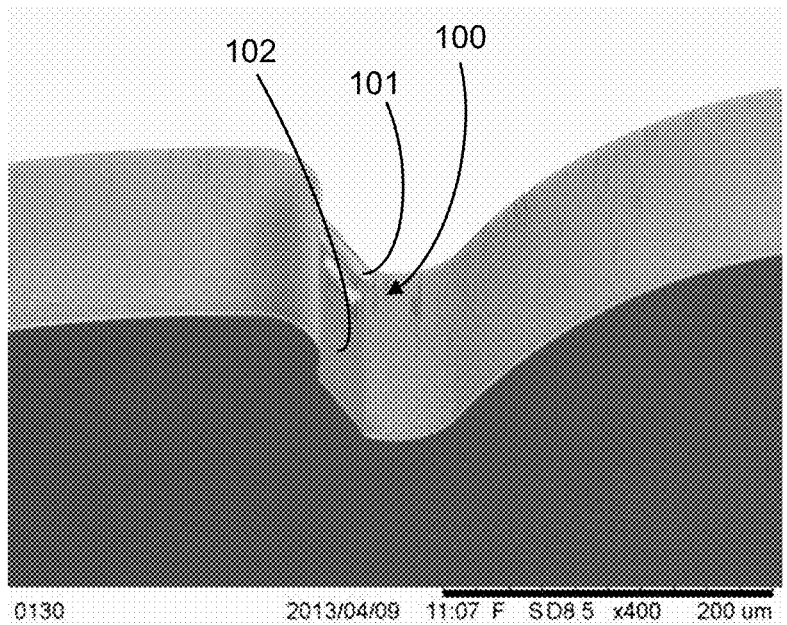

The freed horology component 1 comprises, on its edge face, a fracture surface 100, as depicted by way of illustrative example in FIG. 7B. This surface 100 comprises two distinct adjacent parts, one of them, 102, etched and the other, 101, fractured. The part 102 corresponds to one of the U-shaped lateral walls of the etched opening 5, whereas the part 101 corresponds to the bottom of the fractured U. For comparative purposes, FIG. 7A depicts a fracture surface 100' obtained with an attachment according to the prior art, with no predetachment zone 4. It may be seen that the fracture surface 100 in FIG. 7B is sharper, cleaner and less extensive than the fracture surface 100'.

It is possible to envision various forms of embodiment of the predetachment zone 4. FIGS. 3, 4 and 5 schematically depict three distinct exemplary embodiments. For the sake of clarity, elements that are analogous or that correspond and that are depicted in the various figures bear the same references.

In FIG. 3, the predetachment zone 4 comprises an opening 5 in the form of a trench which extends at the connecting end connecting the attachment 3 to the component 1, across the entire width of the attachment 3, along a straight fracture line. This is an embodiment analogous to that of FIGS. 1A and 1B.

In FIGS. 4 and 5, the predetachment zone 4 comprises a plurality of etched openings 5 aligned along the fracture line (this line having not been depicted for the sake of clarity, but being analogous to that of FIG. 3) and separated by non-etched bridges. The bridges and the openings 5 here have the same length. They may obviously have different lengths. The openings 5 are of parallelepipedal shape. They may be blind, namely etched into part of the thickness of the sheet, or through-openings, namely openings etched through the entire thickness of the sheet. The embodiments of FIGS. 4 and 5 differ in terms of the dimensions of the openings 5. In FIG. 4, the openings 5 have a width (in the direction y) of 2 μm and a length (in the direction x) of 10 μm. In FIG. 5, the openings 5 have a width (in the direction y) of 2 μm and a length (in the direction x) of 2 μm. Of course, the dimensions and shapes of the openings 5 could differ. The dimensions of the openings 5 aligned along the fracture line may, for example, be as follows:

length (along the fracture line) comprised between 2 μm and 10 μm;
width comprised between 1 μm and 5 μm;
depth greater than or equal to half the thickness of the sheet.

Figure 8:
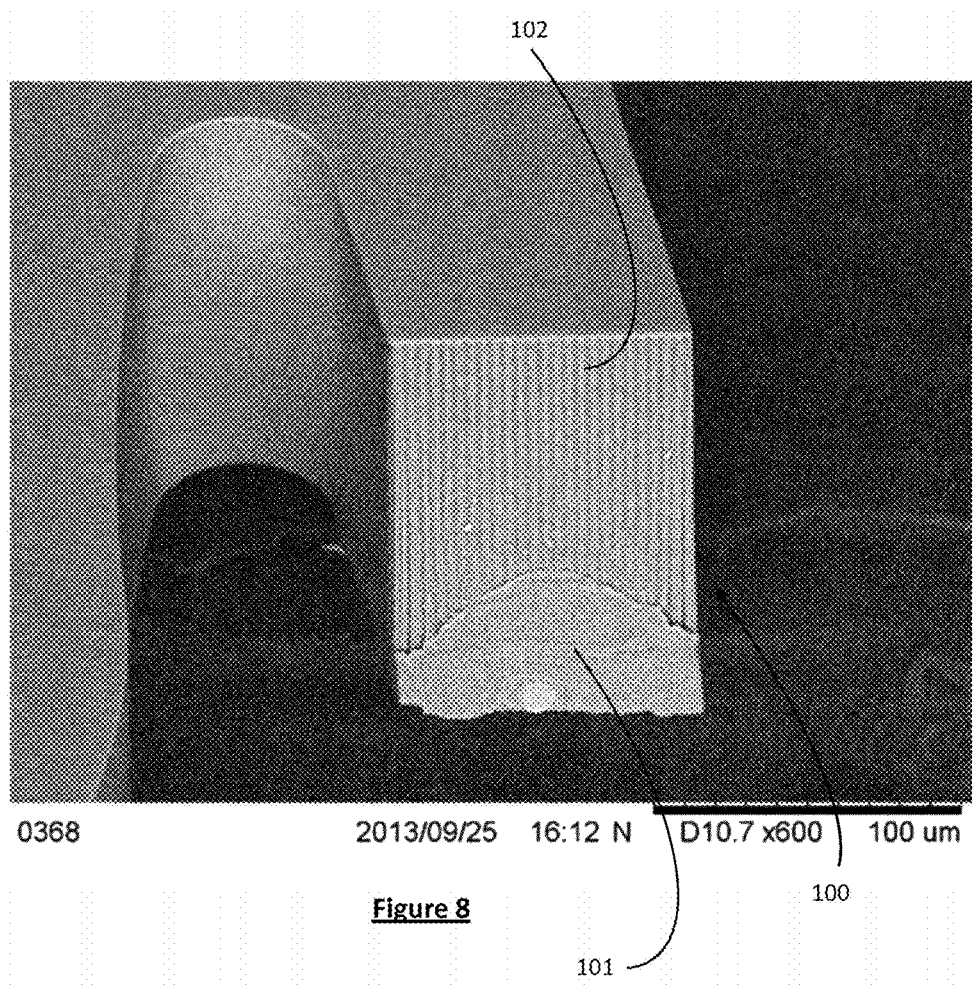
FIG. 8 depicts another illustrative example of a fracture surface obtained by implementation of the method of the invention.

FIG. 8 depicts, by way of illustrative example, a fracture zone 100 obtained with a predetachment zone 4 comprising a plurality of openings 5 aligned along a fracture line and having the following characteristics:

width of the attachment 3 at the connecting end connecting it to the component 1 of 100 μm,
width of predetachment openings 5 of 4 μm;
length of predetachment openings 5 of 2 μm;
space between openings of 2 μm;
depth of openings 5 equal to approximately 80% of the total thickness of the sheet.

In this case, the fracture zone 100 comprises a fractured part 101 (namely a fracture surface obtained by the fracturing of the material) and a part 102 comprising an alternating succession of etched grooves and fractured grooves, arranged vertically. The two parts 101 and 102 are arranged one underneath the other in the thickness direction of the component 1. Note that in FIG. 8, the boundary between the fractured part 101 and the grooved part 102 is curved because the etching rate is not equal over the entire length of the fracture line, the zones situated close to the ends of this fracture line being attacked more rapidly than in the middle.

In the foregoing description, the horology component 1 and the opening or openings 5 are etched at the same time. As an alternative, the etching of the opening or openings 5 and that of the horology component 1 may be performed separately. In that case, the opening or openings may be produced by various ablation techniques, for example by DRIE, by femtosecond pulse ablation using laser equipment, by mechanical ablation (diamond-tipped saw) or the like. For preference, the horology component 1 and the opening or openings 5 are etched at the same time.

In order to etch the horology component 1 and the opening (or openings) 5 of the predetachment zone separately, it is possible to provide two masking steps. In that case, a first masking step is performed for etching the opening or openings 5 of the predetachment zone 4. A second masking step is then performed for etching the horology component 1 and its attachments 3, while protecting the opening or openings 5. It might also be possible to envision the opposite, namely performing a first masking in order to etch the through-openings that allow the horology component 1 and its attachments 3 to be formed, followed by a second masking for etching the predetachment opening or openings 5 while protecting the through-openings. The masking may consist of a mechanical masking or of a masking performed by photolithography using a photosensitive resin.

In the case of simultaneous etching of the horology component 1 and of the predetachment opening or openings 5, the depth of the opening(s) 5 is dependent on various parameters associated with the etching of the horology component, notably the speed of attack of the DRIE etching device and the duration of the attack. Furthermore, the depth of the opening(s) 5 is also dependent on the width and length of this or these opening(s) 5. In any event, in this case, the duration of attack by the etching device is the same for creating both the openings intended to form the component and the predetachment opening or openings 5 at the same time. It is therefore preferable for the width of the predetachment openings 5 to be less than the width of the through-openings that form the horology component or, when the through-openings that form the horology component have different widths from one another, less than the smallest of the widths of the through-openings that form the horology component. In particular, if the width of the through-openings that form the component is greater than 40 μm, and/or is contained in a range of values comprised between 40 μm and 100 μm, or is greater than 100 μm, the width of the predetachment openings 5 will advantageously be between 1 and 10 μm, or even between 1 and 5 μm. Thus, when the through-openings intended to form the horology component and the predetachment opening or openings are created simultaneously, the width chosen for the predetachment opening or openings 5 according to the invention is ultimately dependent on the shortest of the widths of the through-openings that form the horology component and on the desired depth of the predetachment opening or openings. In addition, the width of the predetachment opening or openings may be dependent on specifics of the DRIE etching method and/or equipment used. A person skilled in the art will know how to carry out the adjustment tests required in order to determine the optimum width for the predetachment openings 5.

The method may also comprise additional processing steps, carried out before or after the component has been freed, such as a prior thinning of the sheet of micromachinable material (in order to reduce the thickness thereof), the deposition of a coating, an oxidation heat treatment, a cleaning/degreasing operation, etc.

Various forms or alternative forms of embodiment of the predetachment zone will now be described with reference to FIGS. 10A to 10F. In these figures, the fracture line along which the predetachment zone extends is denoted "L".

Figures 10A, 10B:
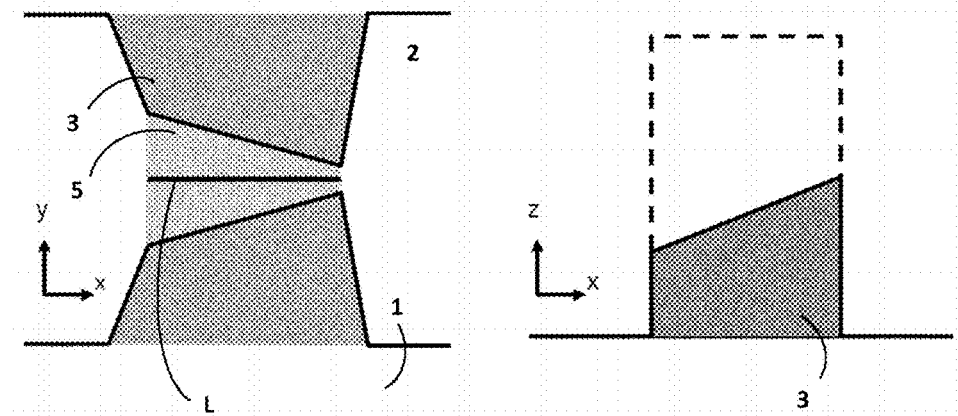
FIGS. 10A to 10F depict a detailed view of the predetachment zone of an attachment between a horology component and a sheet of micromachinable material, according to a first embodiment (FIGS. 10C and 10D), a second embodiment (10E and 10F) and another embodiment (10A and 10B).

In the case of a predetachment zone comprising a continuous opening 5, of the kind depicted in FIGS. 1A and 1B, a predetachment opening 5 of variable width could be etched along the fracture line. In that case, that could make it possible also to vary the depth of the opening along the fracture line, denoted L, as depicted in FIGS. 10A and 10B, which respectively depict a view from above of an attachment 3 between the sheet 2 and the component 1 and a zoomed-in view in section in the plane defined by the axes x and z, of the predetachment opening 5.

Figures 10C, 10D:
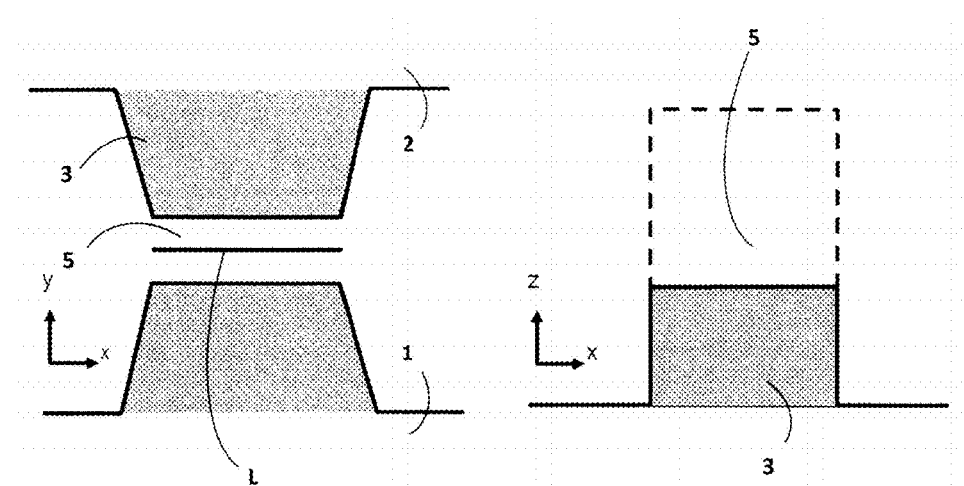

By way of comparison, FIGS. 10C and 10D respectively depict a view from above of an attachment 3 between the sheet 2 and the component 1 and a zoomed-in view in section in the plane defined by the axes x and z of the predetachment opening 5 according to the first embodiment in which the width and depth of the predetachment opening 5 are constant along the fracture line L.

Figures 10E, 10F:
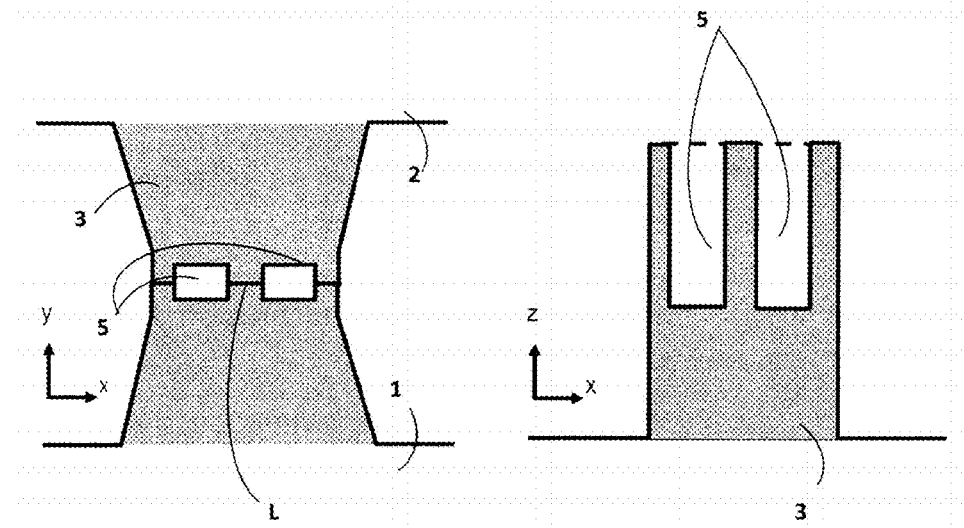

FIGS. 10E and 10F respectively depict a view from above of an attachment 3 between the sheet 2 and the component 1 and a zoomed-in view in section in the plane defined by the axes x and z of the predetachment opening 5 according to the second embodiment in which the predetachment zone comprises a plurality of openings aligned along the fracture line L.

The presence of a fracture line is advantageous because it makes it possible to determine precisely the location and extent of the fracture surface. Such is not the case when using a technique known from the prior art that consists, for example, in providing a simple bridge of material or a bridge of material of lesser width and/or of lesser thickness. In that case, the location of the fracture is not precisely determined. It may lie anywhere along the bridge of weakened material, and may just as easily be close to the component as to the rest of the sheet. This results in uncertainty as to the location of the fracture. In addition, in some cases, the fracture impairs the esthetic appearance of the component or even its functional effectiveness, and this proves to be particularly troublesome.

The invention also relates to a horology component having a partially etched fracture zone. A "fracture zone" means the portion of edge face of the component (across the entire thickness of the component) that contains one or more fracture surfaces. According to the embodiment of the method for manufacturing the component, the fracture zone may comprise:
- a fully etched part and a fully fractured part arranged one above the other (in the thickness direction of the component);
- a part comprising an alternating succession of etched grooves and fractured grooves, and an entirely fractured part, which are arranged one above the other (in the thickness direction of the component);
- an alternating succession of etched grooves and of fractured grooves (over the entire thickness of the component).

The invention claimed is:

1. A horology component made of a micromachinable material having a uniform thickness, comprising a partially etched fracture zone, wherein the partially etched fracture zone comprises:
   an etched surface etched into the thickness of the component, and
   a fractured surface adjacent to the etched surface and extending in a tangential direction of an edge face of the horology component, formed by detachment of an attachment at a connecting end of the attachment that connected the attachment to the component in the fracture zone,
   wherein the fractured surface is aligned with a portion of the etched surface adjacent the fractured surface,
   wherein the fractured surface and the etched surface are aligned with a free edge of the component adjacent the fracture zone,
   wherein a material of the component is a brittle material, and wherein the material of the component is selected from the group consisting of silicon, diamond, quartz and ceramic, and
   wherein said horology component is made of the micromachinable material wherein a width of an opening of the partially etched fracture zone is less than a width of a through-opening defining the free edge of the horology component.

2. The horology component as claimed in claim 1, wherein the free edge of the horology component has been formed by etching the component throughout the entire thickness of the component and the etched surface etched into the thickness of the component has been obtained by etching part of the thickness of the component.

3. The horology component as claimed in claim 2, wherein the etched free edge and the etched surface etched into the thickness of the component have been obtained by deep reactive ion etching.

4. The horology component as claimed in claim 1, wherein the etched surface etched into the thickness of the component extends along the entirety of a line of desired fracture.

5. The component as claimed in claim 1, wherein the partially etched fracture zone comprises a plurality of openings aligned along the line of desired fracture.

6. The horology component as claimed in claim 1, the width of the through-opening defining the free edge of the component is greater than 40 µm and the width of the opening of a predetachment zone is comprised between 1 and 10 µm.

7. The horology component as claimed in claim 6, wherein the width of the opening of the predetachment zone is comprised between 1 and 5 µm.

8. The horology component as claimed in claim 1, wherein the width of the opening of a predetachment zone is less than the smallest of widths of a plurality of through-openings defining the free edge the horology component.

9. The horology component as claimed in claim 1, wherein the brittle material has a brittleness so that, during freeing of the horology component, fracture is brought about by applying a mechanical force to the attachment in a direction that is at an angle less or equal to 45° with respect to a direction perpendicular to the component.

10. The horology component as claimed in claim 1, wherein the horology component is selected from the group consisting of a balance spring, a wheel, a hand, a spring, a pallet and a balance-wheel.

11. The horology component as claimed in claim 1, wherein the depth of the etched surface adjacent the fractured surface is less than or equal to 60% of the thickness of the component.

12. The horology component as claimed in claim 11, wherein a width of the fractured surface defining a free edge of the component is between 20 to 150 µm.

13. The horology component as claimed in claim 1, wherein a width of the fractured surface defining a free edge of the component is between 20 to 150 µm.

14. A horology component made of a micromachinable material having a uniform thickness, comprising a partially etched fracture zone, wherein
   a) the horology component is a component of a horology movement; and
   b) the partially etched fracture zone comprises:
   an etched surface etched into the thickness of the component, and a fractured surface adjacent to the etched surface and extending in a tangential direction of an edge face of the horology component, formed by detachment of an attachment at a connecting end of the attachment that connected the attachment to the component in the fracture zone, wherein the fractured surface is aligned with a portion of the etched surface adjacent the fractured surface, wherein the fractured surface and the etched surface are aligned with a free edge of the component adjacent the fracture zone, and wherein a material of the component is a brittle material, and wherein the material of the component is selected from the group consisting of silicon, diamond, quartz and ceramic.

15. The horology component as claimed in claim 14, wherein the horology movement is a movement selected from the group consisting of a hand or a spring.

16. A horology component made of a micromachinable material having a uniform thickness, comprising a partially etched fracture zone, wherein the partially etched fracture zone comprises:

an etched surface etched into the thickness of the component, and a fractured surface adjacent to the etched surface and extending in a tangential direction of an edge face of the horology component, formed by detachment of an attachment at a connecting end of the attachment that connected the attachment to the component in the fracture zone, wherein the fractured surface is aligned with a portion of the etched surface adjacent the fractured surface, wherein the fractured surface and the etched surface are aligned with a free edge of the component adjacent the fracture zone, wherein a material of the component is a brittle material, and wherein the material of the component is selected from the group consisting of silicon, diamond, quartz and ceramic, and wherein the partially etched fracture zone further includes:

a) a width of the fractured surface being between 20 to 150 µm; and b) said etched surface and said fractured surface including an alternating succession of etched surfaces and fractured surfaces, and wherein said alternating succession of etched surfaces either a) has a depth less than the thickness of the component or b) has a depth extending entirely through the thickness of the component.

17. The horology component as claimed in claim 16, wherein the brittle material has a brittleness such that, during freeing of the horology component, fracture is brought about by applying a mechanical force to the attachment in a direction that is at an angle less or equal to 45° with respect to a direction perpendicular to the component.

18. A horology component made of a micromachinable material having a uniform thickness, comprising a partially etched fracture zone, wherein the partially etched fracture zone comprises:

an etched surface etched into the thickness of the component, and a fractured surface adjacent to the etched surface and extending in a tangential direction of an edge face of the horology component, formed by detachment of an attachment at a connecting end of the attachment that connected the attachment to the component in the fracture zone, wherein the fractured surface is aligned with a portion of the etched surface adjacent the fractured surface, wherein the fractured surface and the etched surface are aligned with a free edge of the component adjacent the fracture zone, wherein a material of the component is a brittle material, and wherein the material of the component is selected from the group consisting of silicon, diamond, quartz and ceramic, and wherein the partially etched fracture zone further includes:

a) a width of the fractured surface being between 20 to 150 µm; and b) said etched surface including a fully etched part and said fractured surface including a fully fractured part, which are arranged one above the other in the thickness direction, and wherein a depth of the etched surface adjacent the fractured surface is less than or equal to 60% of the thickness of the component.

* * * * *